(12) United States Patent
Epple

(10) Patent No.: US 12,743,022 B2
(45) Date of Patent: Sep. 22, 2026

(54) PROJECTION LENS, PROJECTION EXPOSURE APPARATUS AND PROJECTION EXPOSURE METHOD

(71) Applicant: Carl Zeiss SMT GmbH, Oberkochen (DE)

(72) Inventor: Alexander Epple, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 49 days.

(21) Appl. No.: 18/781,500

(22) Filed: Jul. 23, 2024

(65) Prior Publication Data

US 2025/0004382 A1 Jan. 2, 2025

Related U.S. Application Data

(63) Continuation of application No. PCT/EP2023/051584, filed on Jan. 23, 2023.

(30) Foreign Application Priority Data

Jan. 31, 2022 (DE) ..................... 10 2022 201 002.7

(51) Int. Cl.
*G03F 7/00* (2006.01)

(52) U.S. Cl.
CPC ...... *G03F 7/70266* (2013.01); *G03F 7/70241* (2013.01)

(58) Field of Classification Search
CPC ........ G02B 13/143; G02B 13/24; G02B 9/64; G03F 7/70241; G03F 7/70266; G03F 7/70316; G03F 7/70958
See application file for complete search history.

(56) References Cited

U.S. PATENT DOCUMENTS 3,748,015 A 7/1973 Offner
4,293,188 A 10/1981 McMahon
(Continued)

FOREIGN PATENT DOCUMENTS

CN 102279457 A 12/2011
CN 102298198 A 12/2011
(Continued)

OTHER PUBLICATIONS

German office Action, with translation thereof, for corresponding DE Appl No. 10 2022 201 002.7, dated Oct. 6, 2022.
(Continued)

*Primary Examiner* — Peter B Kim

(57) ABSTRACT

Dioptric projection lens for imaging a pattern in an object plane into an image plane via electromagnetic radiation at an operating wavelength in the ultraviolet range of longer than 280 nm comprises a multiplicity of lens elements between the object plane and the image plane along an optical axis configured so that a pattern in the object plane is able to be imaged into the image plane via the lens elements, with a stop plane suitable for attaching an aperture stop between the object plane and the image plane, a chief ray of the imaging intersecting the optical axis in the stop plane. The projection lens is designed as a large field lens with an object field radius of at least 52 mm and has a structure with an imaging scale of 1:1 which is mirror symmetric with respect to the stop plane.

21 Claims, 6 Drawing Sheets

(56) References Cited

U.S. PATENT DOCUMENTS

| | | | | |
|---|---|---|---|---|
| 2003/0227693 | A1 | 12/2003 | Otomo | |
| 2004/0001191 | A1 | 1/2004 | Kohda et al. | |
| 2009/0080086 | A1* | 3/2009 | Shafer ................ | G03F 7/70241 359/651 |
| 2009/0190208 | A1 | 7/2009 | Shafer et al. | |

FOREIGN PATENT DOCUMENTS

| | | | |
|---|---|---|---|
| CN | 103676096 | A | 3/2014 |
| CN | 112 415 865 | A | 2/2021 |
| DE | 102008015775 | A1 | 12/2008 |
| JP | 2002014281 | A | 1/2002 |
| JP | 2002072080 | A | 3/2002 |
| JP | 2002-250865 | A | 9/2002 |
| JP | 2004-012825 | A | 1/2004 |
| WO | WO 2007/131161 | | 11/2007 |

OTHER PUBLICATIONS

International Search Report and Written Opinion for corresponding PCT Appl No. PCT/EP2023/051584, dated May 2, 2023.
Office Action in Japanese Appln. No. 2024-545876, mailed on Sep. 1, 2025, 10 pages (with English translation).
Notice of Allowance in Korean Appln. No. 10-2024-7029151, mailed on Jun. 23, 2026, 4 pages (with English translation).

* cited by examiner

OA
OF
OBH
x
y
B*
A*
RS
PO
WS
W
ILL
WST
ES = OS
M
SS
IS
LS
CU
Z
Y
x
g
h
i
I
360
440
λ [nm]

PROJECTION LENS, PROJECTION EXPOSURE APPARATUS AND PROJECTION EXPOSURE METHOD

CROSS-REFERENCE TO RELATED APPLICATIONS

The present application is a continuation of, and claims benefit under 35 USC 120 to, international application No. PCT/EP2023/051584, filed Jan. 23, 2023, which claims benefit under 35 USC 119 of German Application No. 10 2022 201 002.7, filed Jan. 31, 2022. The entire disclosure of each of these applications is incorporated by reference herein.

FIELD

The disclosure relates to a dioptric projection lens for imaging a pattern arranged in an object plane of the projection lens into an image plane of the projection lens via electromagnetic radiation at an operating wavelength in the ultraviolet range of longer than 280 nm, a projection exposure apparatus equipped with the projection lens and a projection exposure method that can be carried out with the aid of the projection lens.

BACKGROUND

Microlithographic projection exposure methods are predominantly used nowadays for producing semiconductor components and other finely structured components, for example masks for photolithography. Here, use is made of masks (reticles) or other pattern generating devices, which carry or form the pattern of a structure to be imaged, for example a line pattern of a layer of a semiconductor component. The pattern is positioned in the region of the object plane of the projection lens between an illumination system and a projection lens in a projection exposure apparatus and illuminated by illumination radiation provided by the illumination system. The radiation modified by the pattern travels through the projection lens as projection radiation, the projection lens imaging the pattern onto the substrate to be exposed. The surface of the substrate is arranged in the image plane of the projection lens, which image plane is optically conjugate to the object plane. The substrate is generally coated with a radiation-sensitive layer (resist, photoresist).

Typically, the demands of the semiconductor component manufacturers are different for the exposure of critical and non-critical structures. Currently, critical structures, that is to say fine structures, are predominantly produced using dioptric or catadioptric immersion systems that operate with operating wavelengths in the deep ultraviolet range (DUV), such as at approximately 193 nm. By now, finest structures are exposed using EUV systems. Typically, these are projection exposure apparatuses constructed using reflective components only, which operate at operating wavelengths in the extreme ultraviolet range (EUV) between approximately 5 nm and 20 nm, for example at approx. 13.4 mm.

Non-critical structures, that is to say coarser structures, can be exposed using simpler and hence more cost-effective systems.

For the purposes of producing mid-critical or non-critical layers with typical structure dimensions of significantly more than 150 nm, work is conventionally carried out using projection exposure apparatuses that are constructed for operating wavelengths of more than 280 nm. In this wavelength range, use is usually made of dioptric (refractive) projection lenses, the production of which is easily controllable on account of their rotational symmetry about the optical axis.

Projection exposure apparatuses for operating wavelengths at 365.5 nm±2 nm (so-called i-line systems) are commonly used for these applications. They use the i-line of a mercury vapour lamp, with the natural full bandwidth thereof being restricted with the aid of a filter, or in any other way, to a narrower used bandwidth $\Delta\lambda$, for example of approx. 4 nm or 5 nm. During the projection, ultraviolet light of a relatively broad wavelength band is used such that the projection lens brings about a relatively strong correction of chromatic aberrations in order to ensure low-aberration imaging at the sought-after resolution, even with a broadband projection light.

There have also been proposals in the past to design projection lenses so that they are corrected in very broadband fashion for all three mercury lines (e.g., WO 2007/131161). More light is available for the imaging if all Hg lines are used, as a result of which exposure times can be shortened in comparison with conventional i-line systems and hence the throughput (number of exposed components per unit time) can be increased.

SUMMARY

The disclosure seeks to provide a projection lens, a projection exposure apparatus and a projection exposure method which operate with UV radiation at operating wavelengths of longer than 280 nm and which enable high throughput rates.

According to an aspect, the disclosure provides a dioptric projection lens configured to image a pattern arranged in the object plane of the projection lens into the image plane of the projection lens with the aid of electromagnetic radiation at an operating wavelength in the ultraviolet range of longer than 280 nm. All optical elements equipped with refractive power are lens elements, that is to say refractive optical elements. The lenses are arranged between the object plane and the image plane along an optical axis and are embodied in their totality to bring about this imaging. A stop plane suitable for attaching an aperture stop is located between the object plane and the image plane, a chief ray of the imaging intersecting the optical axis in the stop plane.

According to the disclosure, the projection lens can be designed as a large field lens with an object field height of at least 52 mm and has a structure which is mirror symmetric with respect to the stop plane and an imaging scale of 1:1. This corresponds to an imaging scale of $|\beta|=1$.

In this application, the phrase "large field lens" denotes a projection lens which, on account of the size of its usable object field, is designed such that at least the full width of a complete 6" reticle (current standard size) can be exposed in a single exposure step. The usable size of the object field is quantified by the object field height OBH in this case. This corresponds to the object field radius, that is to say the radius of the minimal circle enclosing those object field points for which the optical correction satisfies the specification, that is to say is sufficiently good. This circle is large enough that the effective object field actually used for the imaging is enclosed.

The projection lens can be a stepper lens. In this case, a stepper lens is understood to mean an optical imaging system which is able to image a 6" reticle with an object field of 104*132 $mm^2$ (corresponding to a half diagonal of 84 mm) in full onto a wafer in a single exposure without scanning. To this end, the projection lens is correctable so that the optical aberrations are corrected in an object field with an object field radius of 84 mm.

According to a development, the projection lens has an object field radius OBH of 84 mm or more. On account of the 1:1 imaging scale, 16 (sixteen) "dies" can be exposed at the same time in a step-and-repeat process. This is conducive to a high throughput of the process. However, the correction of aberrations can be made more difficult as a result of the increased object field radius.

A scanner system is an alternative to the stepper. In this case, only a part of the object field is imaged by the projection lens at any one time. Therefore, a scanning movement during which adjacent sections of the reticle are successively transferred to the substrate is used to carry out a single exposure step. So as to transfer the complete pattern of the 6" reticle in a single exposure step with scanning, the effective object field can have a width of 104 mm. This is achievable with an object field radius of at least 52 mm and can significantly simplify the correction of the aberrations. An object field radius of 55 mm would lead to a slit height of no more than approximately 35 mm (as measured in the scanning direction). However, the slit height can be 56 mm; an object field radius of 59 mm being used to this end. A sufficient luminous intensity at the wafer, inter alia, is obtained using such slit dimensions.

Initially, the phrase "stepper system" only specifies the size of the object field to be imaged. Furthermore, the imaging scale $\beta$ of the system then can decide the size of the exposed image field. In this case, the typical dimensions can be provided by the dimensions of a single "die" of 26*33 $mm^2$. If the (reducing) imaging scale is 4:1, a stepper with a 6" reticle can fully expose exactly one single "die" in one exposure. On account of the 1:1 imaging scale, 16 (sixteen) "dies" consequently can be exposed at the same time in a single exposure step.

As a result, the throughput in comparison with conventional systems can be increased.

Substantial challenges in the design can relate to three dimensions, specifically (i) the field size, that is to say the field radius within which the aberrations can be corrected, (ii) the corresponding numerical aperture which is identical on the object side and image side in the case of 1:1 systems, and (iii) the level of aberration to be obtained.

The first two points are often combined in what is known as geometric étendue LLW. The geometric étendue LLW can be defined as the product of the (dimensionless) object-side numerical aperture NAO and the object field size parameterized by the object field height OBH (in millimetres), that is to say $$LLW = |OBH * NAO|$$

If the field size to be corrected is modified, for instance increased from a scanner field to a stepper field, then the numerical aperture can be adjusted accordingly (i.e., reduced) in order to have success with the same number of correction mechanisms.

The projection lens can be designed such that an (object-side and image-side) numerical aperture NA is less than 0.3, such as NA=0.25 or less. For example, the numerical aperture can be between 0.1 and 0.2, such as at 0.18. On account of the very moderate NA, the Rayleigh unit $RU=\lambda/NA^2$, which specifies a measure for the depth of field, is relatively large, and so the remaining secondary spectrum is generally negligible. Consequently, this can simplify the correction of aberrations.

Axially relatively compact projection lenses can be realized within the scope of the disclosure. According to a development, the projection lens has an installation length TT ("total track length") measured between the object plane and the image plane, an object field radius OBH and an object-side numerical aperture NAO, and the following condition applies: (OBH*NAO)/TT>0.01.

The installation length can be of the order of one meter, for example ranging between 800 mm and 1200 mm, such as at 1000 mm.

In comparison with certain known systems, projection lenses of the type presented here may obtain relatively high geometric étendue values. According to a development, the projection lens has a geometric étendue LLW=OBH*NAO of at least 10 mm, the geometric étendue optionally being 15 mm or more. The étendue can be considered to be a measure for the performance of an imaging system. In general, the greater the étendue, the "more" the system can image, for example a larger field (if OBH becomes large) or finer structures (if a larger NA is used).

What is common to embodiments is that they are purely dioptric designs. Consequently, only lens elements are used. This can simplify manufacturing, inter alia. The use of mirrors, for example as known from catadioptric Offner systems (see, for example U.S. Pat. Nos. 3,748,015, 4,293,188 or US 2004/0001191 A1), is deliberately dispensed with even though this would simplify the correction of aberrations, for example field curvature or longitudinal chromatic aberration.

Projection lenses according to the disclosure have a consequent mirror symmetry vis-a-vis the stop plane. The stop plane is arranged halfway between the object field (reticle) and image field (wafer). This means that every lens element occurring in the first lens part upstream of the stop (between object plane and stop plane) has an identically designed corresponding part arranged in mirror symmetric fashion in the second lens part downstream of the stop.

The symmetric structure can be desirable, inter alia when correcting aberrations. The transverse chromatic aberration can be intrinsically corrected by way of the symmetry of the structure, just like the distortion and coma aberrations and the chromatic variations thereof. Hence, no separate correction mechanisms are used to this end.

Optionally, use is only made of UV radiation of the Hg i-line. This is a substantial difference vis-à-vis conventional systems, which are corrected in very broadband fashion for all three mercury lines. More light is available for the imaging if all Hg lines are used, but the correction of aberrations over relatively large object field radii appears to be difficult.

Exemplary embodiments are provided or designed for use with a light wavelength of approximately 365.5 nm and/or with a bandwidth of a few nm (no more than 5 nm). Therefore, a longitudinal correction of the primary spectrum (longitudinal chromatic aberration) can be sufficient.

In the case of dioptric projection lenses operated in broadband fashion, different lens element materials with sufficiently different dispersion properties are often used for colour correction (i.e., for the correction of chromatic aberrations), the lens element materials being distributed within the projection lens into regions with different ray height ratios. Transparent materials used in the typical i-line projection lenses include, for example, synthetic fused silica ($SiO_2$) and the specialist glasses made commercially available under the designations FK5, LF5 and LLF1 by SCHOTT, Mainz, Germany. In these optical glasses, the synthetic fused silica and the FK5 glass are typical representatives of glasses with relatively low dispersion (crown glasses), while the glasses LF5 and LLF1 are typical representatives of glasses with relatively high dispersion (flint glasses). Other manufacturers use different names for their types of glasses.

Accordingly, lens elements made of a crown glass are referred to as "crown lens elements" and lens elements made of a flint glass are also referred to as "flint lens elements" within this application.

The longitudinal chromatic aberration can be corrected by the use of a combination of at least one crown lens element with positive refractive power and at least one flint lens element with negative refractive power, for example. This lens element pair can be arranged in a region of the optical imaging system in which the marginal ray of the imaging has a ray height (marginal ray height) that is as large as possible. In general, this is the case in a stop region in the vicinity of the system stop.

As a result of the symmetry of the structures, exemplary embodiments have the lens elements on both sides of the stop plane comprise at least one flint lens element made of a first material with a relatively low Abbe number and a plurality of crown lens elements made of a second material with a higher Abbe number relative to the first material. At least one flint lens element is used to correct the chromatic aberrations, and can be used in the design. If no material with anomalous partial dispersion is used as flint material, a secondary spectrum sets in automatically in the longitudinal direction. By way of example, this is the case for the available materials such as LF5 or LLF1 or comparable glasses.

The inventor has recognized that flint material can have some undesirable properties. By way of example, flint glasses typically exhibit a reduced transmission of the used light, which is tantamount to increased absorption. This may lead to unwanted side-effects such as lens heating and/or compaction of the material. Further, the current flint materials transparent in the wavelength range above 280 m (e.g., around 365 nm) all have a significant proportion of lead and further heavy metals, and so use of these glasses is only permitted with special authorization. Equivalent lead-free alternative glasses are practically not available at this time. Therefore, the development of projection lenses with a reduced use of flint lens elements in comparison with known systems can be desirable.

The use of flint lens elements is reduced in a targeted manner in some exemplary embodiments, optionally in such a way that no more than two flint lens elements are arranged on each side of the stop plane. In some embodiments, the use of flint lens elements can be reduced to such an extent that only a single flint lens element, such as a flint lens element with negative refractive power, is used in each of the lens parts.

Some exemplary embodiments have at least one crown lens element with positive refractive power and at least one flint lens element with negative refractive power and no more than two flint lens elements with negative refractive power are arranged on each side of the stop plane in a stop region around the stop plane, in which the condition $|CRH/MRH|<1$ applies to a ray height ratio CRH/MRH between a chief ray height CRH and a marginal ray height MRH of the imaging. Optionally, only a single flint lens element with negative refractive power is provided in the stop region on each side of the stop plane.

Further details regarding options for correcting aberrations, such as the longitudinal chromatic aberration (CHL), are explained in conjunction with the exemplary embodiments.

BRIEF DESCRIPTION OF THE DRAWINGS

Further features and aspects of the disclosure are evident from the claims and from the description of exemplary embodiments of the disclosure, which will be explained below with reference to the figures, in which:

DETAILED DESCRIPTION

Figure 1:
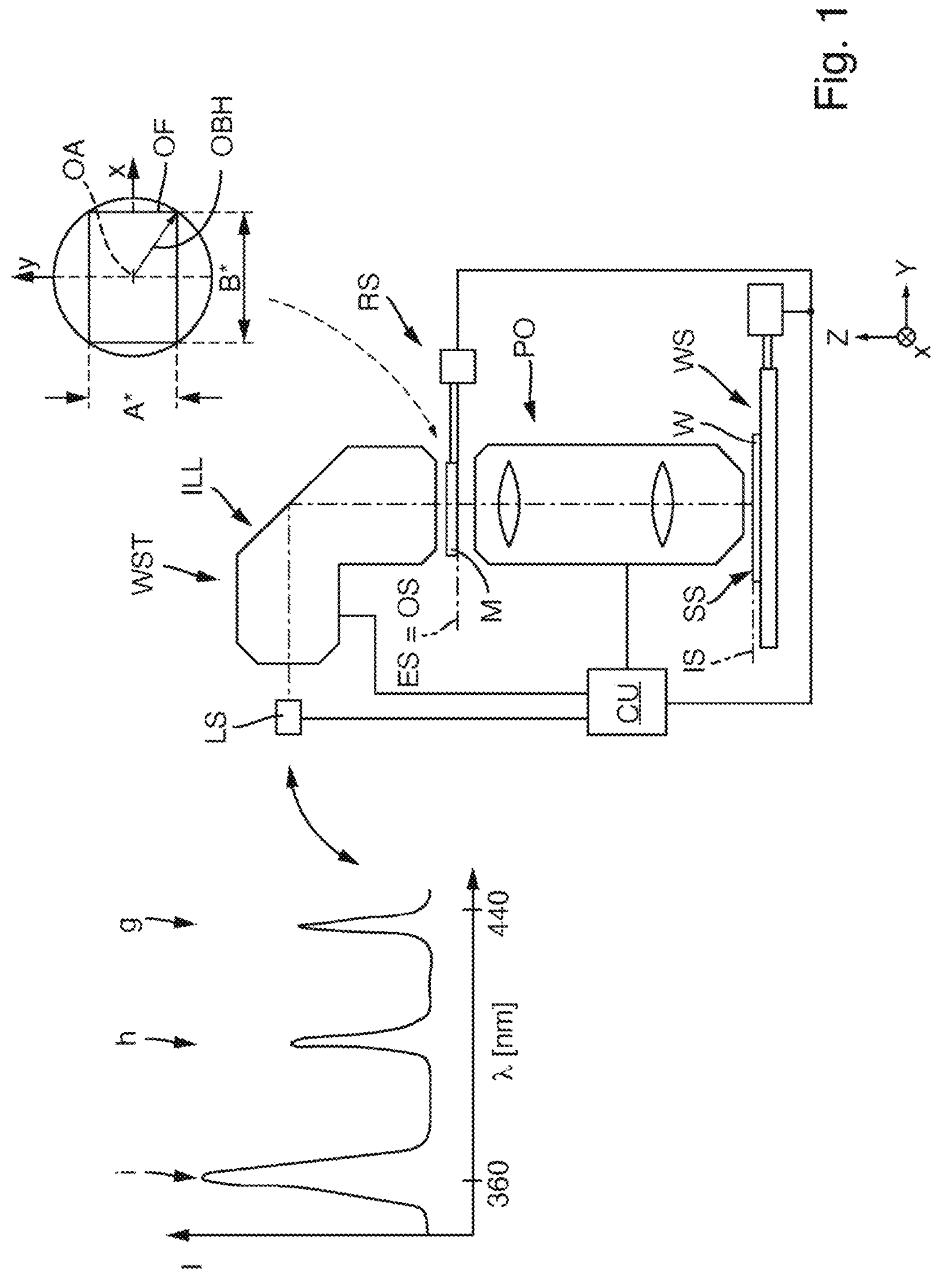
FIG. 1 shows a schematic illustration of a projection exposure apparatus according to one exemplary embodiment.

FIG. 1 shows an example of a microlithographic projection exposure apparatus WST, which is utilizable in the production of semiconductor components and other finely structured components and which operates with light or electromagnetic radiation from the ultraviolet (UV) range in order to obtain resolutions down to fractions of micrometres. A mercury vapour lamp serves as primary radiation source or as light source LS. The lamp emits a broad spectrum with emission lines of relatively high intensity I in wavelength ranges with centroid wavelengths at approx. 436 nm (visible light, blue, g-line), approx. 405 nm (visible light, purple, h-line) and approx. 365.5 nm (near ultraviolet, UV-A, i-line). This part of the spectrum is illustrated in the schematic $I(\lambda)$ diagram.

The projection exposure apparatus is an i-line system which only uses the light from the i-line, that is to say UV light around a central operating wavelength of approx. 365.5 nm. The natural full bandwidth of the i-line is restricted with the aid of a filter, or in any other way, to a narrower used bandwidth $\Delta\lambda$, for example of approx. 5 nm.

At its exit surface ES, an illumination system ILL disposed downstream of the light source LS generates a large, sharply delimited and substantially homogeneously illuminated illumination field, which is adapted to the desired telecentricity of the projection lens PO arranged downstream thereof in the light path. The illumination system ILL has devices for setting different illumination modes (illumination settings) and, for example, it can be switched between conventional on-axis illumination with different degrees of coherence $\sigma$ and off-axis illumination.

Those optical components which receive the light from the light source LS and form illumination radiation from the light, which illumination radiation is directed to the reticle M, are part of the illumination system ILL of the projection exposure apparatus.

Arranged downstream of the illumination system is a device RS for holding and manipulating the mask M (reticle) in such a way that the pattern arranged at the reticle lies in the object plane OS of the projection lens PO, which coincides with the exit plane ES of the illumination system and which is also referred to here as reticle plane OS.

Following downstream of the reticle plane OS is the projection lens PO, that is to say an imaging system, which images an image of the pattern arranged at the mask M with a defined imaging scale $\beta$ onto a substrate W coated with a photoresist layer, the light-sensitive substrate surface SS of which lies in the region of the image plane IS of the projection lens PO.

The substrate to be exposed, which is a semiconductor wafer W in the exemplary case, is held by a device WS that is also referred to as "wafer stage".

The illumination field produced by the illumination system ILL defines the effective object field OF used during the projection exposure. In the exemplary case, the latter is rectangular, has a height A*measured parallel to the y-direction and has a width B*<A*measured perpendicular thereto (in the x-direction). The aspect ratio AR=B*/A*is approximately 104/132. The effective object field lies centred to the optical axis (on-axis field). With a system with this field size, a typical 6" reticle can be brought to imaging in a single exposure step.

The effective image field in the image area IS and optically conjugate to the effective object field has the same shape and the same aspect ratio between height B and width A as the effective object field. In the case of the depicted 1:1 system (imaging scale $|\beta|=1$), the image field has the size of the effective object field.

A few words on the field sizes. If the field size of the image field is 26×33 mm, then a complete "die" can be exposed in a single exposure step without scanning. The term "die" denotes a single unpackaged piece of a semiconductor wafer in semiconductor and microsystems technology. Accordingly, the projection exposure apparatus can be designed as a wafer stepper for a step-and-repeat process. It is possible to dispense with devices for carrying out scanning operations for the exposure of a die. The projection exposure apparatus may also be designed as a wafer scanner for a step-and-scan process. In that case, devices for carrying out scanning operations for the exposure of a die can be provided.

In the rotationally symmetric system, the circle which is centred around the optical axis OA, which encloses an effective object field OF and which touches the corners thereof specifies the size of the object field within which the optical correction at all field points meet the specification. This then also applies to all field points in the effective object field. The correction of aberrations becomes more complicated the larger this object field has to be. In this case, the size of the circle is parameterized by the object field radius (or half the object field diameter) OBH, which simultaneously corresponds to the maximum field height of an object field point.

The exemplary embodiment is a stepper system with 1:1 imaging, as a result of which 16 dies can be exposed simultaneously.

For a better understanding of aspects of the exemplary embodiments described below, a few explanations in respect of chromatic aberrations and the correction thereof in dioptric (refractive) optical systems are initially presented in order to elucidate the terms used in this application and the meanings thereof.

Chromatic aberrations are imaging aberrations of optical systems that arise due to the fact that the refractive index n of transparent optical materials varies as a function of the wavelength $\lambda$. This dependence $dn/d\lambda$ is referred to as a dispersion of the optical material. In general, the refractive index of optical materials is greater for shorter wavelengths than for longer wavelengths.

Chromatic aberrations can be subdivided into various categories. A first category of chromatic aberrations takes account of the fact that a dedicated image is produced for each wavelength in the paraxial region (on the optical axis) and that these images may vary in respect of their position along the optical axis, their form and/or their size. The chromatic aberrations of the first category include the longitudinal chromatic aberrations CHL (axial chromatic aberration, axial colour, AX) and the chromatic magnification aberrations or the chromatic difference of magnification CHV (lateral colour LAT).

The longitudinal chromatic aberration is the longitudinal aberration of the paraxial focal position as a function of wavelength. If the refractive index for shorter wavelengths is greater than for longer wavelengths, the shorter wavelengths are refracted more strongly at each optical surface such that, for example in the case of a simple positive lens element, the rays of the relatively shorter wavelength are brought together at a focal position that lies closer to the lens element than the focus of the relatively longer wavelength. The paraxial distance along the optical axis of the lens element between the two focal points is the longitudinal chromatic aberration. If the rays with a shorter wavelength are focused closer to the imaging system than the rays of longer wavelength, the longitudinal chromatic aberration is usually referred to as "under-corrected" or "negative".

If an imaging system forms images with different sizes for different wavelengths or the image of an off-axis point forms a colour fringe, a chromatic magnification aberration or a chromatic difference of magnification (CHV) is present. The chromatic difference of magnification can be quantified by the lateral distance between the paraxial image heights of the different wavelengths.

The dispersion, that is to say the chromatic variation of the refractive index, of the utilized optics materials may also cause variations of monochromatic aberrations, which may be combined in a second category of chromatic aberrations. By way of example, these include the chromatic variation of the spherical aberration, the chromatic variation of the field curvature, etc.

For a further characterization of possible aberrations, the imaging with light from a broadband radiation source is considered, the latter emitting light with different wavelengths around a central wavelength $\lambda$, wherein the radiation distribution is characterizable by a spectral bandwidth $\Delta\lambda$ (full width at half maximum). Typically, the extent of chromatic aberrations increases with increasing spectral bandwidth $\Delta\lambda$. Chromatic aberrations can be characterized with the aid of the focal positions for the different wavelengths along the optical axis for three wavelengths within the spectral bandwidth. The three wavelength components have the wavelengths $\lambda_1$, $\lambda_2$ and $\lambda_3$, where $\lambda_1<\lambda_2<\lambda_3$.

The size of the longitudinal chromatic aberration CHL then corresponds to the maximum length of the focal range along the optical axis into which the different wavelengths are focused. Typically, one of the wavelengths is focused closer to the imaging system than the other wavelengths. The distance between the closest focal position of the wavelengths and the focal position of the wavelengths furthest away corresponds to the size of the longitudinal chromatic aberration of the imaging system for the broadband light source. The focal position of the central wavelength $\lambda$ along the optical axis can be considered to be the image plane within the focal range.

The variation of the paraxial focus position with the wavelength is normally expanded in a power series. In this case, the linear portion is referred to as "primary spectrum" and the quadratic portion is referred to as "secondary spectrum"; moreover, it is also possible to define a "tertiary spectrum" by way of the cubic portion.

The primary spectrum can be corrected by combining converging and diverging lens elements that consist of different optical materials with different dispersion. More specifically, it is possible to correct the longitudinal chromatic aberration in such a way that the paraxial focal planes for two different wavelengths, for example the minimum 21 and the maximum $\lambda_3$ wavelength of the spectral range, coincide on the optical axis. Such optical imaging systems are also referred to as "achromatized" or as an "achromat" in this application.

As a rule, a longitudinal chromatic aberration remainder remains for other wavelengths that are not captured by the correction. This longitudinal chromatic aberration remainder is usually the "secondary spectrum".

In some cases, it is also possible to correct the secondary spectrum by a suitable choice of optical materials, lens element dimensions, distances and refractive powers, etc. The secondary spectrum may possibly be corrected to such an extent that the focal positions of all three wavelengths $\lambda_1$, $\lambda_2$ and $\lambda_3$ of the considered wavelength range lie at the same axial position; only the "tertiary spectrum" remains in turn. In this application, an optical system where the secondary spectrum is also corrected is also referred to as "apochromatically corrected" or as an "apochromat".

Expressed differently, the longitudinal chromatic aberration for two spaced apart wavelengths becomes very small (possibly down to a value of zero) in the case of an achromatic imaging system. The longitudinal chromatic aberration for three spectrally spaced apart wavelengths becomes very small (possibly down to a value of zero) in the case of an apochromatic optical imaging system.

In dioptric projection lenses that are intended to operate with spectrally broadband light sources, different lens element materials with Abbe numbers with differences that are as large as possible are used for the correction of chromatic aberration. The Abbe number v facilitates a characterization of the dispersion properties of a material in a wavelength range of interest. By way of example, the Abbe number of a material can be calculated using the following formula:

$$v=(n_2-1)/(n_1-n_3),$$

where $n_1$, $n_2$ and $n_3$ are the refractive indices of the material at wavelengths of $\lambda_1$, $\lambda_2$ and $\lambda_3$, and $\lambda_1<\lambda_2<\lambda_3$ applies. In general, low Abbe numbers represent materials with a relatively strong dispersion and high Abbe numbers represent materials with a relatively weak dispersion. Therefore, the Abbe number is sometimes also referred to as "reciprocal relative dispersion".

In this case, the Abbe number $V_{Hg}$ can be related to the range of the ultraviolet spectral range. To this end, use is made of the refractive indices $n_1$, $n_2$, $n_3$ of the mercury spectral lines at 365.0 (i-line for $n_1$), 404.7 (h-line for $n_2$) and 435.8 nm (g-line for $n_3$). The Abbe numbers for the glasses utilized are listed in Table 7.

Lens element materials for operating wavelengths at emission lines of a mercury vapour lamp can be divided into three different groups, depending on their refractive index and their Abbe number. A first group includes those materials whose Abbe number is found in the range from 40 to 70. Here, the Abbe number is calculated for the wavelengths of $\lambda_1$=365.01 nm, $\lambda_2$=404.65 nm and $\lambda_3$=435.84 nm, which correspond to the wavelengths of the i-, h- and g-emission lines of the mercury vapour lamp. The materials in the first group have typical refractive indices in the range from 1.46 to 1.56 at the mercury i-line. The materials of the first group include, inter alia, synthetic fused silica ($SiO_2$) and various borosilicate glasses, such as BK7 glass or the glasses K5, K7 or FK5.

A second group comprises materials with Abbe numbers of greater than 70. Some materials in the second group, for example crystalline calcium fluoride (fluorspar or $CaF_2$), have a refractive index of less than 1.46.

A third group comprises materials with Abbe numbers of less than 40. These materials have refractive indices of more than approximately 1.56. The materials of the third group include, inter alia, typical flint glasses such as LLF-6 glass, LLF-1 glass or LF-5 glass.

For the purposes of reducing chromatic aberrations by refractive mechanisms, an optical system can have lens elements made of at least two materials with different dispersions or different Abbe numbers. Thus, first optical elements made of a first material with a relatively low Abbe number and second optical elements made of a second material with a higher Abbe number relative to the first material can be combined.

As a rule, materials of the second group are used as relative crown materials. As a rule, materials of the third group are used as relative flint materials. Materials of the first group can act as relative crown material in combination with a material from the third group and as relative flint material in combination with a material from the second group. By way of example, in combination with a material of the third group (for example LF5, LLF1, LLF6), synthetic fused silica ($SiO_2$) acts as a relative crown material. By contrast, if synthetic fused silica is combined with a material of the second group B, for example $CaF_2$, the synthetic fused silica acts as a relative flint material.

Within the scope of this application, first materials with a relatively low Abbe number are also referred to as "relative flint materials" and second materials with a relatively higher Abbe number are also referred to as "relative crown materials". To simplify matters, lens elements made of a relative crown material are also referred to as "crowns lens elements" for short and lenses made out of a relative flint material are also referred to as "flint lens elements" for short in a more specific exemplary embodiment in this application. As a rule, materials from the first and the third material group are used.

In the following description of embodiments of projection lenses, the term "optical axis" denotes a straight line through the centres of curvature of the curved lens element surfaces. In the examples, the object is a mask (reticle) with the pattern of an integrated circuit; it may also relate to a different pattern, for example of a grating. In the examples, the image is projected onto a wafer provided with a photoresist layer, the wafer acting as a substrate. Other substrates are also possible, for example elements for liquid crystal displays or substrates for optical gratings.

Some peculiarities can be elucidated on the basis of the profiles and the relationships between chief rays and marginal rays of the imaging. In this case, a chief ray CR refers to a ray which starts from an edge point of the object field and intersects the optical axis in the region of the pupil plane, that is to say in the region of a stop plane BE suitable for attaching an aperture stop AS. A marginal ray MR within the meaning of the present application leads from the centre of the object field to the edge of the aperture stop. The perpendicular distance of these rays from the optical axis yields the corresponding ray height. To the extent that this application refers to a "marginal ray height" (MRH) or a "chief ray height" (CRH), this refers to the paraxial marginal ray height and the paraxial chief ray height, respectively.

The term "stop region" BB denotes a region around the stop plane BE (that is to say, upstream and downstream of the stop plane), in which the ray height ratio |CRH/MRH| between the chief ray height CRH and the marginal ray height MRH of the imaging is less than one. Consequently, relatively large marginal ray heights occur in the stop region.

In the figures of the drawing, crown lens elements, such as fused silica lens elements or lens elements made of FK5, are represented by open lens elements and flint lens elements, such as lens elements made of LF5 or LLF1, are represented by hatched lens elements. Aspherical surfaces are marked by short asphere dashes.

The specifications of the projection lenses shown in the figures of the drawing are indicated in the tables compiled at the end of the description, the numbering of which tables respectively corresponds to the numbering of the corresponding figure of the drawing.

Tables 2 to 6 summarize the specification of the respective design in tabular form. In this case, column "SURF" indicates the number of a refractive surface or surface distinguished in some other way, column "RADIUS" indicates the radius r of the surface (in mm), column "THICKNESS" indicates the distance d—designated as thickness—between the surface and the subsequent surface (in mm) and column "MATERIAL" indicates the material of the optical components. Columns "INDEX1", "INDEX2" and "INDEX3" indicate the refractive index of the material at the wavelengths 365.5 nm (INDEX1), 364.5 nm (INDEX2) and 366.5 nm (INDEX3). Column "SEMIDIAM" indicates the usable, free radii or the free optical semidiameters of the lens elements (in mm) or of the optical elements. The radius r=0 (in the column "RADIUS") corresponds to a plane surface. Some optical surfaces are aspherical. Tables with appended "A" indicate the corresponding asphere data, wherein the aspherical surfaces are calculated according to the following specification:

$$p(h) = \frac{\varrho h^2}{1+\sqrt{1-(1+K)(\varrho h)^2}} + C_1 h^4 + C_2 h^6 + C_3 h^8 + \dots$$

In this case, the reciprocal $$\frac{1}{r} = \varrho$$

of the radius indicates the surface curvature and h indicates the distance between a surface point and the optical axis (i.e., the ray height). Consequently, p (h) indicates the sagittal height, that is to say the distance between the surface point and the surface vertex in the z-direction (direction of the optical axis). The coefficients K, C1, C2, . . . are represented in the tables with appended "A".

Table 7 provides an overview of certain design parameters of the exemplary embodiments, for example numerical aperture NA, object field radius OBH and imaging scale.

In the following description of exemplary embodiments, the same reference signs are used in all figures for the same or corresponding features. Lens elements are numbered in their sequence from the object plane to the image plane, and so, for example, the lens element L1 is the first lens element immediately following the object plane. Not all lens elements have been provided with a reference sign for reasons of clarity.

Figure 2:
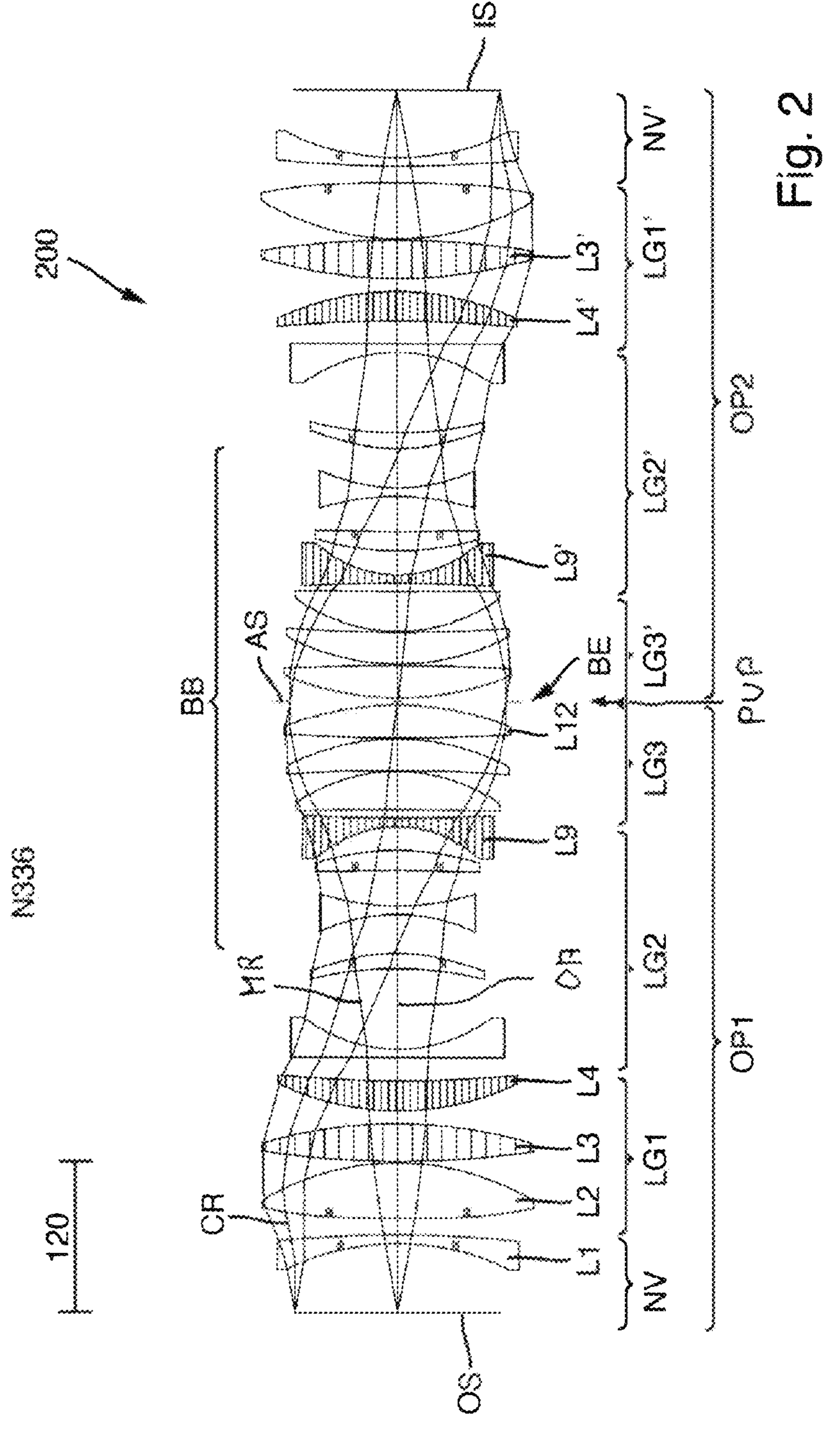
FIG. 2 shows a schematic meridional lens element sectional view of a projection lens according to a first exemplary embodiment.

FIG. 2 shows a schematic meridional lens element sectional view of a first exemplary embodiment of a dioptric projection lens 200 with selected beams for elucidating the imaging beam path or the projection beam path of the projection radiation passing through the projection lens during operation.

The projection lens is provided as a 1:1 imaging system, for imaging a pattern of a mask arranged in its object plane OS onto its image plane IS aligned parallel to the object plane directly, i.e., without producing an intermediate image, and without a change in size, specifically in the scale of −1:1 (the imaging scale is −1).

Between the object plane and the image plane, the only pupil plane PUP of the imaging system lies where the chief ray CR of the optical imaging intersects the optical axis OA. The aperture stop AS of the system is attached in the region of the pupil plane. Therefore, the position or plane suitable for attaching the aperture stop is also referred to as stop plane BE here.

A stop region BB extends around the stop plane, the condition |CRH/MRH|<1 applying to a ray height ratio between the chief ray height CRH and the marginal ray height MRH of the imaging in the stop region BB. Thus, the marginal ray height is higher than the chief ray height. The optical structure can be follows:

In the object-side first lens part OP1, the object plane OS is followed immediately by a front lens element group NV with negative refractive power ("negative group"), which is provided by an object-side concave meniscus lens element L1 with negative refractive power.

A first lens element group LG1 with positive refractive power and a total of three lens elements L2 to L4 immediately follows this. The first lens element group collects the rays coming from the front negative group and, as a result, forms a bulge in the projection beam path.

A second lens element group LG2 with negative refractive power immediately follows the first lens element group LG1. This second lens element group comprises the five lens elements L5 to L9 and produces a waist around a local minimum of the marginal ray height between the object plane OS and the stop plane BE in the projection beam path.

A third lens element group LG3 with positive refractive power and a total of three lens elements L10 to L12 immediately follows the second lens element group LG2. The lens elements of the third lens element group are arranged between the second lens element group LG2 and the stop plane suitable for attaching an aperture stop AS.

On account of the mirror symmetry with respect to the stop plane, a mirrored refractive power sequence arises on the other side of the stop plane BE in the image-side second lens part OP2. Each lens element Lx of the first lens part OP1 between object plane OS and stop plane BE has a mirrored, identical corresponding part Lx' in the second lens part OP2 between stop plane and image plane IS.

By way of example, three positive lens elements are arranged directly next to the stop plane on both sides. According to a conventional teaching, it would be desirable to attach a flint negative lens element next to the stop plane since the marginal ray height is greater there and the flint lens element, as a result, would have a better effect in relation to the longitudinal chromatic aberration. However, the assumption is currently made that, for the purposes of obtaining a good correction state in a large object field, it is more desirable if at least two, optionally also three positive lens elements are arranged directly next to the stop plane. p The projection lens can have the refractive power sequence N-P-N-P-P-N-P-N, where "P" represents a lens element group with positive refractive power and "N" represents a lens element group with negative refractive power. There is only a single pronounced waist on each side of the stop plane, in the region of the negative second lens element group LG2.

The first exemplary embodiment comprises a stepper field with OBH=84 mm in the case of an image-side numerical aperture NA=0.18; the imaging scale is −1. The étendue is LLW=15.12.

This exemplary embodiment has a multiplicity (2×12) of lens elements with relatively little refractive power. The plurality of lens elements (L1, L2, L5-8, L10-12) are manufactured from fused silica. The longitudinal chromatic aberration is corrected by the diverging flint lens element (L9, made of LF5 material).

The two flint lens elements L2 and L3 in the front part have positive refractive power and are counter-productive for the correction of the longitudinal chromatic aberration, but this is negligible on account of the significantly smaller marginal ray height of the lens elements vis-à-vis L9: the contribution of a lens element to the correction of the longitudinal chromatic aberration is proportional to the square of the marginal ray height.

The reason for the use of flint material at this point can rather be seen in the following two properties: (i) The flint lens elements have a higher refractive index. This aids the correction of the monochromatic aberrations such as spherical aberration and astigmatism. (ii) The flint lens elements contribute to the overall flint refractive power of the system and consequently correct the chromatic variation of the Petzval sum.

It is possible to show that the chromatic variation of the Petzval sum vanishes whenever the sum of the individual refractive powers over the various materials vanishes. Therefore, to correct the chromatic variation of the Petzval sum, at least one flint lens element with positive refractive power is also used in addition to the at least one negative lens element made of flint material which is used to correct the longitudinal chromatic aberration.

The design has a pronounced waist structure. Thus, the negative refractive power of L1 enables the formation of a significant bulge of positive lens elements L2, L3, L4. This is followed by a long waist with predominantly negative refractive power (L5, L7, L9) and individual weakly positive lens elements (L6, L8). The beams are then collimated softly by the lens elements L10, L11, L12 and guided through the central aperture stop. The collimation of the beams is a condition for focusing of the image plane, which follows from the symmetry of the structure.

The correction of the aberrations is moreover additionally assisted by the use of 2×4 aspherical surfaces. The aspheres are only on quartz lens elements.

The entire design has an installation length TT (axial distance between object plane and image plane) of 1000 mm, and so the condition (OBH. NAO)/TT>0.01 is observed. There is only a minor deviation from telecentricity on both the object side and the image side.

The same reference signs are used for corresponding or similar features in the following exemplary embodiments, without these being mentioned separately again, for reasons of clarity. The second to fifth exemplary embodiments each comprise a stepper field with OBH=84 mm in the case of an image-side numerical aperture NA=0.18; the imaging scale is −1 and the installation length is 1000 mm each case.

Figure 3:
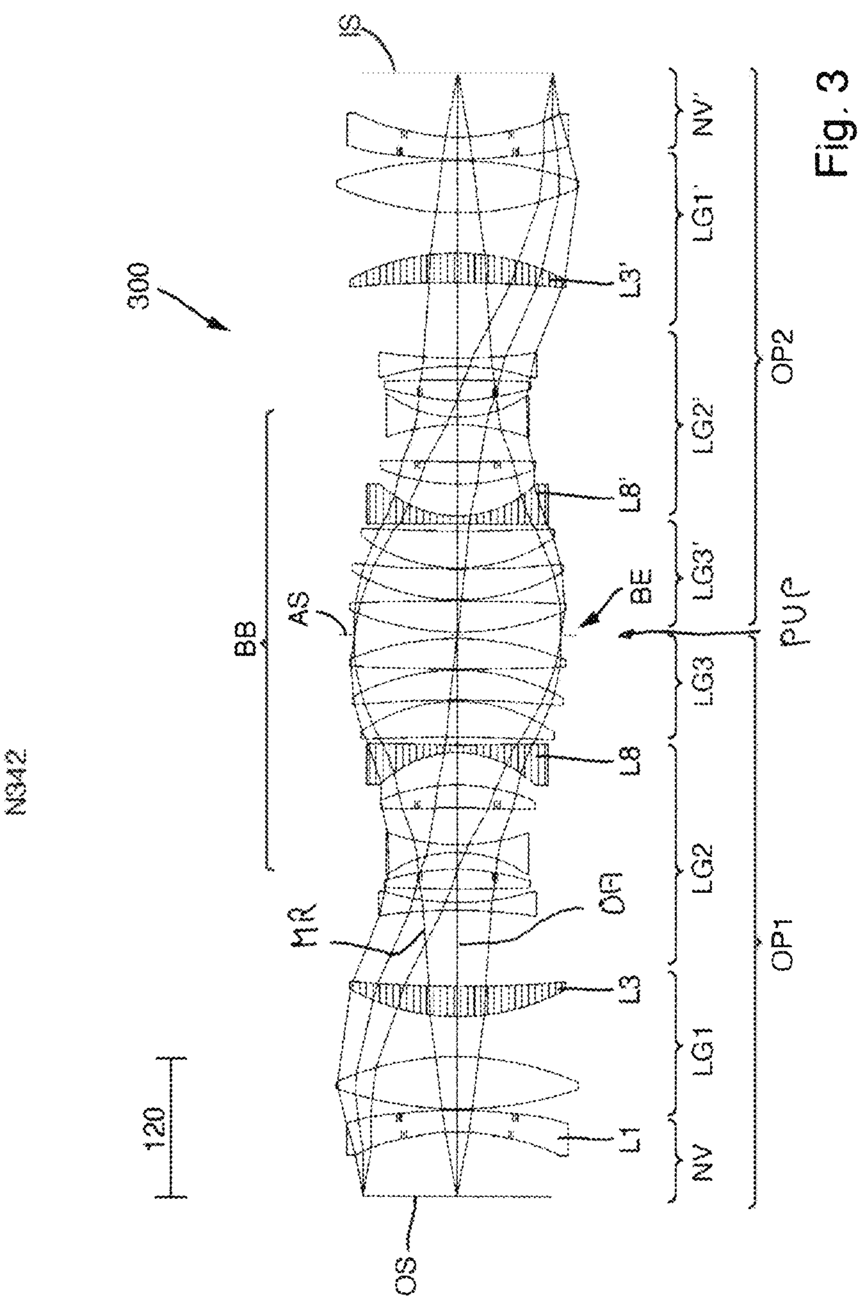
FIGS. 3-6 show schematic meridional lens element sectional views of a projection lens according to a second, third, fourth and fifth exemplary embodiments.

The second exemplary embodiment (projection lens 300 in FIG. 3) has a very similar structure in the stop region BB to the first exemplary embodiment. One difference consists in a double asphere being arranged in each lens part, specifically as the lens elements L1 and L1', respectively, closest to the field, which are each designed as negative meniscus lens elements, the concave side of which pointing to the closest field plane. This contributes to the number of lens elements being able to be reduced by one lens element to only 11 lens elements per lens part. Likewise, the number of flint lens elements was reduced to two flint lens elements per lens part. Just like in the first exemplary embodiment, each lens part includes only a single flint lens element L8 or L8' designed as a biconcave lens element within the stop region BB. Additionally, like in the first exemplary embodiment, an additional positive flint lens element L3 or L3' is arranged in the region closer to the field.

Figure 4:
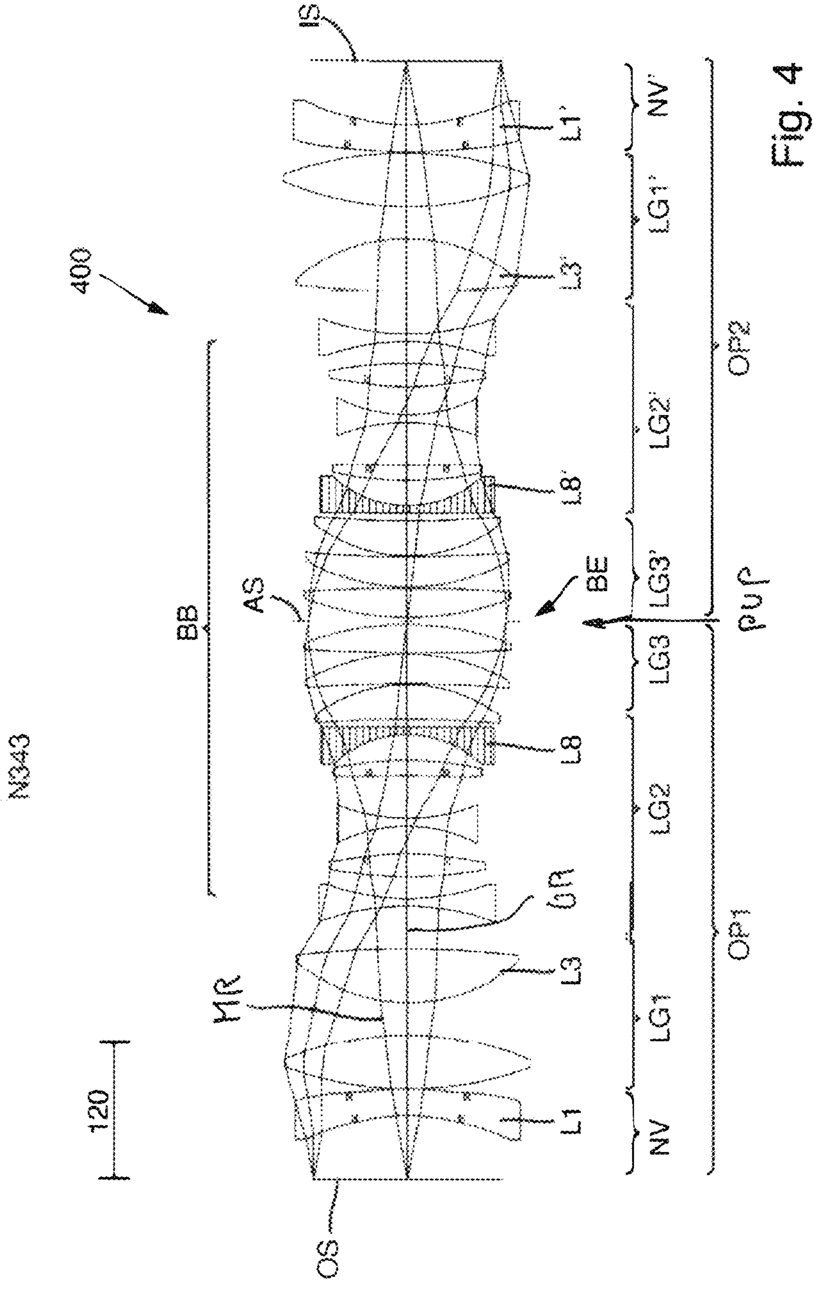

In comparison with the second exemplary embodiment, the third exemplary embodiment (projection lens 400 in FIG. 4) is distinguished in that the positive lens element made of flint material (L3) of the second exemplary embodiment was replaced by a lens element made of fused silica. Consequently, the exemplary embodiment has only a single flint lens element, specifically L8 or L8', per lens part. As a result, the chromatic variation of the Petzval sum can no longer be completely corrected as a matter of principle. However, this appears to be relatively uncritical in relation to the imaging performance on account of the relatively moderate numerical aperture (NA=0.18) and the relatively large depth of field accompanying this.

Figure 5:
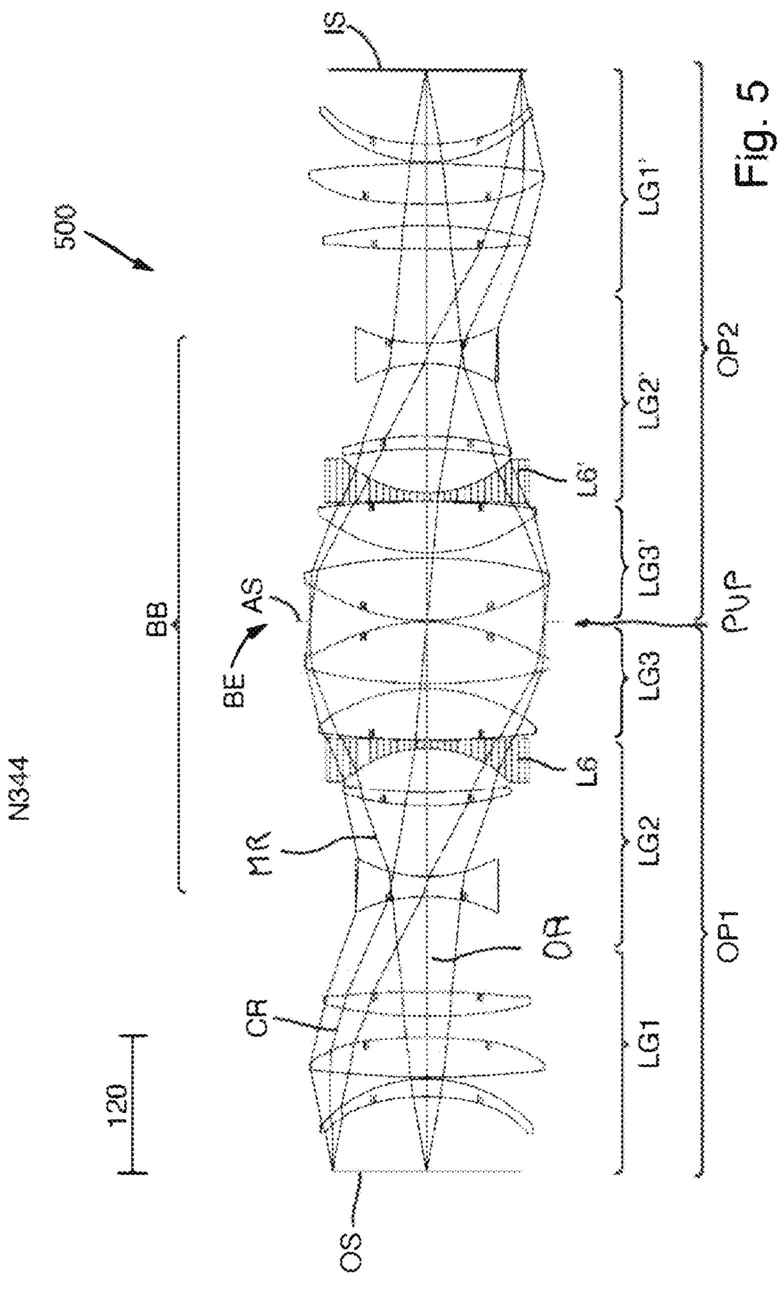

The projection lens 500 in FIG. 5 (fourth exemplary embodiment) is a further example of a minimal use of flint lens elements, by virtue of only one flint lens element being provided per lens part. Moreover, proceeding from the previous exemplary embodiments, it was possible to further reduce the number of utilized lens elements. A contribution to this end was achieved by the use of additional aspheres. In this case, all lens elements not consisting of flint glass are designed as aspherical lens elements with a single aspherical lens element surface. Consequently, the number of aspheres has increased from 2×4 (in the third exemplary embodiment) to 2×6, and as a result the number of lens elements could be reduced to 2×8.

Figure 6:
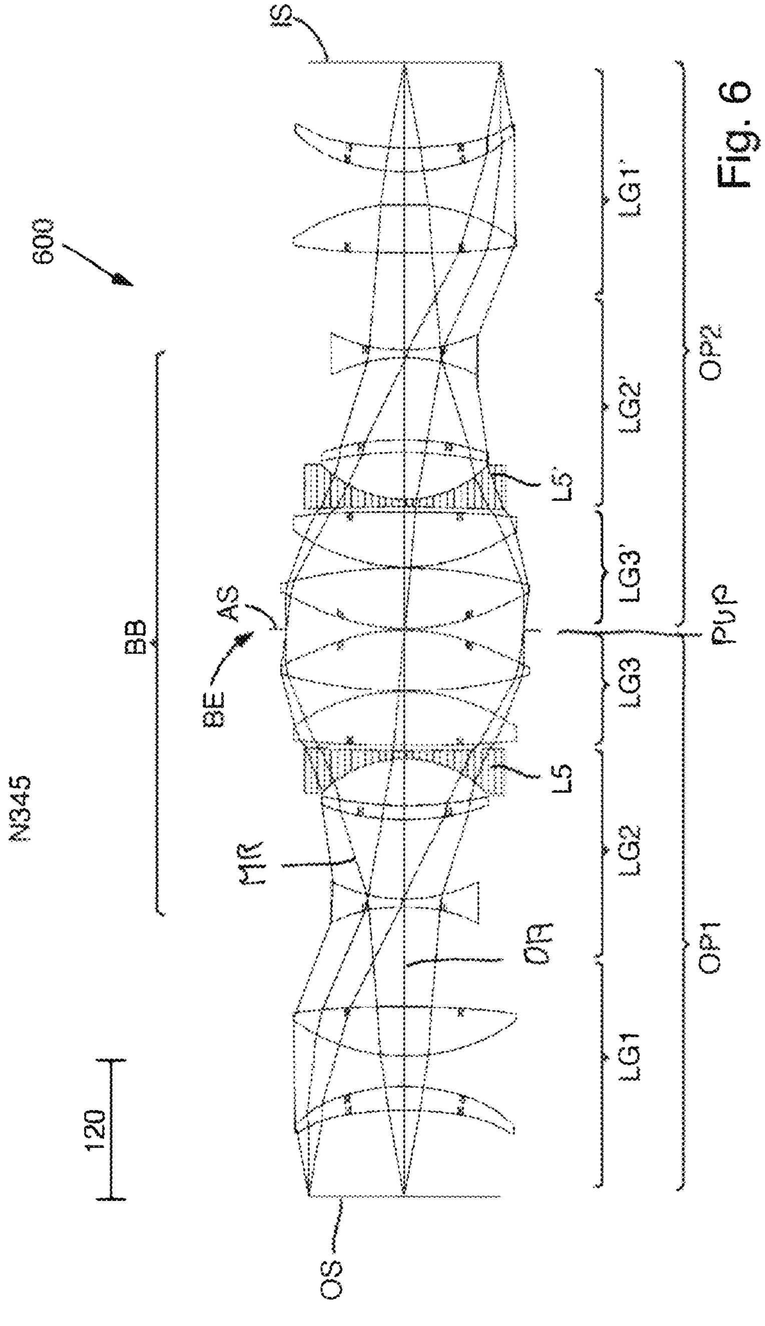

The fifth exemplary embodiment (projection lens 600 in FIG. 6) illustrates that the number of lens elements could be further reduced by the use of a field-near double asphere per lens part (lens element L1 or L1'), the number now being reduced to in each case seven lens elements per lens part.

Symmetric 1:1 lithography systems for the mercury i-line (365.5 nm) with an intended use as a stepper were presented by way of example, that is to say, a complete 6" reticle can be imaged using a single exposure without scanning. However, scanning systems with object fields smaller than 104×132 mm$^2$, for example only 104×28 mm$^2$, may also be used.

TABLE 2

| SURF | RADIUS | THICKNESS | MATERIAL | INDEX1 | INDEX2 | INDEX3 | SEMIDIAM. |
|---|---|---|---|---|---|---|---|
| 0 | 0.000 | 55.489 | | | | | |
| 1 | −200.653 | 6.999 | SILUV | 1.474477 | 1.474623 | 1.474332 | 90.2 |
| 2 | −1010.698 | 13.566 | | | | | 97.5 |
| 3 | 981.347 | 46.056 | SILUV | 1.474477 | 1.474623 | 1.474332 | 108.5 |
| 4 | −211.180 | 1.000 | | | | | 109.8 |
| 5 | 723.111 | 31.131 | LLF1 | 1.579164 | 1.579477 | 1.578854 | 110.0 |

TABLE 2-continued

| SURF | RADIUS | THICKNESS | MATERIAL | INDEX1 | INDEX2 | INDEX3 | SEMIDIAM. |
|---|---|---|---|---|---|---|---|
| 6 | −390.169 | 10.634 | | | | | 109.6 |
| 7 | 226.903 | 24.328 | LF5 | 1.619068 | 1.619457 | 1.618683 | 96.5 |
| 8 | 1049.072 | 18.797 | | | | | 94.1 |
| 9 | 147113.888 | 7.000 | SILUV | 1.474477 | 1.474623 | 1.474332 | 86.3 |
| 10 | 129.093 | 65.380 | | | | | 75.7 |
| 11 | −295.363 | 12.745 | SILUV | 1.474477 | 1.474623 | 1.474332 | 70.0 |
| 12 | −149.865 | 31.821 | | | | | 69.7 |
| 13 | −148.623 | 6.999 | SILUV | 1.474477 | 1.474623 | 1.474332 | 62.4 |
| 14 | 211.535 | 29.110 | | | | | 62.5 |
| 15 | −670.286 | 15.987 | SILUV | 1.474477 | 1.474623 | 1.474332 | 65.5 |
| 16 | −225.414 | 19.748 | | | | | 66.2 |
| 17 | −98.051 | 6.999 | LF5 | 1.619068 | 1.619457 | 1.618683 | 66.1 |
| 18 | 1454.493 | 6.703 | | | | | 77.1 |
| 19 | −4835.846 | 31.764 | SILUV | 1.474477 | 1.474623 | 1.474332 | 79.6 |
| 20 | −146.129 | 1.000 | | | | | 82.3 |
| 21 | −1139.947 | 25.367 | SILUV | 1.474477 | 1.474623 | 1.474332 | 88.4 |
| 22 | −196.150 | 1.000 | | | | | 89.9 |
| 23 | 1706.555 | 27.385 | SILUV | 1.474477 | 1.474623 | 1.474332 | 91.4 |
| 24 | −243.157 | 2.999 | | | | | 91.6 |
| 25 | 0.000 | 2.999 | | | | | 88.2 |
| 26 | 243.157 | 27.385 | SILUV | 1.474477 | 1.474623 | 1.474332 | 91.6 |
| 27 | −1706.555 | 1.000 | | | | | 91.4 |
| 28 | 196.150 | 25.367 | SILUV | 1.474477 | 1.474623 | 1.474332 | 89.9 |
| 29 | 1139.947 | 1.000 | | | | | 88.4 |
| 30 | 146.129 | 31.764 | SILUV | 1.474477 | 1.474623 | 1.474332 | 82.3 |
| 31 | 4835.846 | 6.703 | | | | | 79.6 |
| 32 | −1454.493 | 6.999 | LF5 | 1.619068 | 1.619457 | 1.618683 | 77.1 |
| 33 | 98.051 | 19.748 | | | | | 66.1 |
| 34 | 225.414 | 15.987 | SILUV | 1.474477 | 1.474623 | 1.474332 | 66.2 |
| 35 | 670.286 | 29.110 | | | | | 65.5 |
| 36 | −211.535 | 6.999 | SILUV | 1.474477 | 1.474623 | 1.474332 | 62.5 |
| 37 | 148.623 | 31.821 | | | | | 62.4 |
| 38 | 149.865 | 12.745 | SILUV | 1.474477 | 1.474623 | 1.474332 | 69.7 |
| 39 | 295.363 | 65.380 | | | | | 70.0 |
| 40 | −129.093 | 7.000 | SILUV | 1.474477 | 1.474623 | 1.474332 | 75.7 |
| 41 | −147113.888 | 18.797 | | | | | 86.3 |
| 42 | −1049.072 | 24.328 | LF5 | 1.619068 | 1.619457 | 1.618683 | 94.1 |
| 43 | −226.903 | 10.634 | | | | | 96.5 |
| 44 | 390.169 | 31.131 | LLF1 | 1.579164 | 1.579477 | 1.578854 | 109.6 |
| 45 | −723.111 | 1.000 | | | | | 110.0 |
| 46 | 211.180 | 46.056 | SILUV | 1.474477 | 1.474623 | 1.474332 | 109.8 |
| 47 | −981.347 | 13.566 | | | | | 108.5 |
| 48 | 1010.698 | 6.999 | SILUV | 1.474477 | 1.474623 | 1.474332 | 97.5 |
| 49 | 200.653 | 55.489 | | | | | 90.2 |
| 50 | 0.000 | 0.000 | | | | | 84.0 |

TABLE 2A

| SRF | 1 | 3 | 12 | 15 | 35 |
|---|---|---|---|---|---|
| K | 0 | 0 | 0 | 0 | 0 |
| C1 | 1.556817E−07 | −7.751526E−08 | 1.152818E−07 | 1.106397E−07 | −1.106397E−07 |
| C2 | −3.056346E−11 | 2.390564E−11 | 1.738212E−12 | 2.636125E−12 | −2.636125E−12 |
| C3 | 1.297670E−15 | −2.332133E−15 | 3.881138E−16 | 2.560794E−17 | −2.560794E−17 |
| C4 | 8.491171E−20 | 1.084662E−19 | −6.298423E−20 | 5.839551E−21 | −5.839551E−21 |
| C5 | −1.895677E−23 | −2.295160E−24 | 1.244399E−23 | −2.068605E−24 | 2.068605E−24 |
| C6 | 1.221464E−27 | 1.168621E−29 | −1.244426E−27 | 2.626725E−28 | −2.626725E−28 |

| SRF | 38 | 47 | 49 |
|---|---|---|---|
| K | 0 | 0 | 0 |
| C1 | −1.152818E−07 | 7.751526E−08 | −1.556817E−07 |
| C2 | −1.738212E−12 | −2.390564E−11 | 3.056346E−11 |
| C3 | −3.881138E−16 | 2.332133E−15 | −1.297670E−15 |
| C4 | 6.298423E−20 | −1.084662E−19 | −8.491171E−20 |
| C5 | −1.244399E−23 | 2.295160E−24 | 1.895677E−23 |
| C6 | 1.244426E−27 | −1.168621E−29 | −1.221464E−27 |

TABLE 3

| SURF | RADIUS | THICKNESS | MATERIAL | INDEX1 | INDEX2 | INDEX3 | SEMIDIAM. |
|---|---|---|---|---|---|---|---|
| 0 | 0.000 | 56.960 | | | | | |
| 1 | −152.507 | 19.482 | SILUV | 1.474477 | 1.474623 | 1.474332 | 90.6 |
| 2 | −299.336 | 1.000 | | | | | 98.5 |
| 3 | 330.750 | 46.756 | SILUV | 1.474477 | 1.474623 | 1.474332 | 106.2 |
| 4 | −266.521 | 36.322 | | | | | 106.6 |
| 5 | 205.579 | 26.444 | LF5 | 1.619068 | 1.619457 | 1.618683 | 95.1 |
| 6 | 1122.671 | 67.004 | | | | | 93.1 |
| 7 | −486.776 | 6.997 | SILUV | 1.474477 | 1.474623 | 1.474332 | 69.0 |
| 8 | 227.711 | 11.969 | | | | | 64.5 |
| 9 | 1387.683 | 18.089 | SILUV | 1.474477 | 1.474623 | 1.474332 | 63.7 |
| 10 | −170.878 | 15.194 | | | | | 62.8 |
| 11 | −105.571 | 6.999 | SILUV | 1.474477 | 1.474623 | 1.474332 | 60.9 |
| 12 | 188.530 | 33.004 | | | | | 62.0 |
| 13 | −682.872 | 20.113 | SILUV | 1.474477 | 1.474623 | 1.474332 | 66.9 |
| 14 | −178.054 | 28.329 | | | | | 67.8 |
| 15 | −97.114 | 6.998 | LF5 | 1.619068 | 1.619457 | 1.618683 | 67.7 |
| 16 | 4591.627 | 6.761 | | | | | 79.5 |
| 17 | −1604.813 | 31.793 | SILUV | 1.474477 | 1.474623 | 1.474332 | 82.0 |
| 18 | −148.650 | 0.993 | | | | | 84.9 |
| 19 | −963.024 | 27.129 | SILUV | 1.474477 | 1.474623 | 1.474332 | 91.5 |
| 20 | −188.861 | 0.998 | | | | | 93.0 |
| 21 | 2122.290 | 27.687 | SILUV | 1.474477 | 1.474623 | 1.474332 | 94.9 |
| 22 | −252.641 | 2.991 | | | | | 95.1 |
| 23 | 0.000 | 2.991 | | | | | 91.8 |
| 24 | 252.641 | 27.687 | SILUV | 1.474477 | 1.474623 | 1.474332 | 95.1 |
| 25 | −2122.290 | 0.998 | | | | | 94.9 |
| 26 | 188.861 | 27.129 | SILUV | 1.474477 | 1.474623 | 1.474332 | 93.0 |
| 27 | 963.024 | 0.993 | | | | | 91.5 |
| 28 | 148.650 | 31.793 | SILUV | 1.474477 | 1.474623 | 1.474332 | 84.9 |
| 29 | 1604.813 | 6.761 | | | | | 82.0 |
| 30 | 4591.627 | 6.998 | LF5 | 1.619068 | 1.619457 | 1.618683 | 79.5 |
| 31 | 97.114 | 28.329 | | | | | 67.7 |
| 32 | 178.054 | 20.113 | SILUV | 1.474477 | 1.474623 | 1.474332 | 67.8 |
| 33 | 682.872 | 33.004 | | | | | 66.9 |
| 34 | −188.530 | 6.999 | SILUV | 1.474477 | 1.474623 | 1.474332 | 62.0 |
| 35 | 105.571 | 15.194 | | | | | 60.9 |
| 36 | 170.878 | 18.089 | SILUV | 1.474477 | 1.474623 | 1.474332 | 62.8 |
| 37 | −1387.683 | 11.969 | | | | | 63.7 |
| 38 | −227.711 | 6.997 | SILUV | 1.474477 | 1.474623 | 1.474332 | 64.5 |
| 39 | 486.776 | 67.004 | | | | | 69.0 |
| 40 | −1122.671 | 26.444 | LF5 | 1.619068 | 1.619457 | 1.618683 | 93.1 |
| 41 | −205.579 | 36.322 | | | | | 95.1 |
| 42 | 266.521 | 46.756 | SILUV | 1.474477 | 1.474623 | 1.474332 | 106.6 |
| 43 | −330.750 | 1.000 | | | | | 106.2 |
| 44 | 299.336 | 19.482 | SILUV | 1.474477 | 1.474623 | 1.474332 | 98.5 |
| 45 | 152.507 | 56.960 | | | | | 90.6 |
| 46 | 0.000 | 0.000 | | | | | 84.0 |

TABLE 3A

| SRF | 1 | 2 | 10 | 13 | 33 |
|---|---|---|---|---|---|
| K | 0 | 0 | 0 | 0 | 0 |
| C1 | 3.879678E−07 | 2.680864E−07 | 1.554667E−07 | 1.332664E−07 | −1.332664E−07 |
| C2 | −3.856109E−11 | −3.432170E−11 | 6.188552E−14 | 1.528943E−12 | −1.528943E−12 |
| C3 | −9.892283E−16 | 5.170746E−16 | 5.909591E−16 | −2.362353E−16 | 2.362353E−16 |
| C4 | 5.011228E−19 | 1.752725E−19 | −3.913635E−19 | 4.583681E−20 | −4.583681E−20 |
| C5 | −5.478951E−23 | −1.610997E−23 | 8.348405E−23 | −8.184644E−24 | 8.184644E−24 |
| C6 | 2.692253E−27 | 5.340503E−28 | −1.142445E−26 | 6.330550E−28 | −6.330550E−28 |

| SRF | 36 | 44 | 45 |
|---|---|---|---|
| K | 0 | 0 | 0 |
| C1 | −1.554667E−07 | −2.680864E−07 | −3.879678E−07 |
| C2 | −6.188552E−14 | 3.432170E−11 | 3.856109E−11 |
| C3 | −5.909591E−16 | −5.170746E−16 | 9.892283E−16 |
| C4 | 3.913635E−19 | −1.752725E−19 | −5.011228E−19 |
| C5 | −8.348405E−23 | 1.610997E−23 | 5.478951E−23 |
| C6 | 1.142445E−26 | −5.340503E−28 | −2.692253E−27 |

TABLE 4

| SURF | RADIUS | THICKNESS | MATERIAL | INDEX1 | INDEX2 | INDEX3 | SEMIDIAM. |
|---|---|---|---|---|---|---|---|
| 0 | 0.000 | 57.800 | | | | | |
| 1 | −139.359 | 23.493 | SILUV | 1.474477 | 1.474623 | 1.474332 | 90.6 |
| 2 | −317.928 | 0.999 | | | | | 100.4 |
| 3 | 324.384 | 47.144 | SILUV | 1.474477 | 1.474623 | 1.474332 | 108.2 |
| 4 | −284.373 | 29.328 | | | | | 108.6 |
| 5 | 152.215 | 47.512 | SILUV | 1.474477 | 1.474623 | 1.474332 | 97.6 |
| 6 | −898.785 | 38.018 | | | | | 95.3 |
| 7 | −224.903 | 6.999 | SILUV | 1.474477 | 1.474623 | 1.474332 | 77.2 |
| 8 | 211.078 | 19.405 | | | | | 70.2 |
| 9 | 363.178 | 20.330 | SILUV | 1.474477 | 1.474623 | 1.474332 | 68.1 |
| 10 | −234.067 | 24.784 | | | | | 67.0 |
| 11 | −135.545 | 6.997 | SILUV | 1.474477 | 1.474623 | 1.474332 | 61.6 |
| 12 | 170.803 | 38.010 | | | | | 60.7 |
| 13 | −1050.726 | 13.849 | SILUV | 1.474477 | 1.474623 | 1.474332 | 64.7 |
| 14 | −305.455 | 22.876 | | | | | 65.2 |
| 15 | −95.190 | 6.998 | LF5 | 1.619068 | 1.619457 | 1.618683 | 65.3 |
| 16 | −10858.385 | 6.731 | | | | | 76.4 |
| 17 | −1032.176 | 31.098 | SILUV | 1.474477 | 1.474623 | 1.474332 | 78.8 |
| 18 | −136.299 | 1.014 | | | | | 81.6 |
| 19 | −1050.186 | 26.605 | SILUV | 1.474477 | 1.474623 | 1.474332 | 88.1 |
| 20 | −184.274 | 1.048 | | | | | 89.5 |
| 21 | 1483.193 | 25.695 | SILUV | 1.474477 | 1.474623 | 1.474332 | 90.8 |
| 22 | −264.183 | 3.281 | | | | | 90.9 |
| 23 | 0.000 | 3.281 | | | | | 87.8 |
| 24 | 264.183 | 25.695 | SILUV | 1.474477 | 1.474623 | 1.474332 | 90.9 |
| 25 | −1483.193 | 1.048 | | | | | 90.8 |
| 26 | 184.274 | 26.605 | SILUV | 1.474477 | 1.474623 | 1.474332 | 89.5 |
| 27 | 1050.186 | 1.014 | | | | | 88.1 |
| 28 | 136.299 | 31.098 | SILUV | 1.474477 | 1.474623 | 1.474332 | 81.6 |
| 29 | 1032.176 | 6.731 | | | | | 78.8 |
| 30 | 10858.385 | 6.998 | LF5 | 1.619068 | 1.619457 | 1.618683 | 76.4 |
| 31 | 95.190 | 22.876 | | | | | 65.3 |
| 32 | 305.455 | 13.849 | SILUV | 1.474477 | 1.474623 | 1.474332 | 65.2 |
| 33 | 1050.726 | 38.010 | | | | | 64.7 |
| 34 | −170.803 | 6.997 | SILUV | 1.474477 | 1.474623 | 1.474332 | 60.7 |
| 35 | 135.545 | 24.784 | | | | | 61.6 |
| 36 | 234.067 | 20.330 | SILUV | 1.474477 | 1.474623 | 1.474332 | 67.0 |
| 37 | −363.178 | 19.405 | | | | | 68.1 |
| 38 | −211.078 | 6.999 | SILUV | 1.474477 | 1.474623 | 1.474332 | 70.2 |
| 39 | 224.903 | 38.018 | | | | | 77.2 |
| 40 | 898.785 | 47.512 | SILUV | 1.474477 | 1.474623 | 1.474332 | 95.3 |
| 41 | −152.215 | 29.328 | | | | | 97.6 |
| 42 | 284.373 | 47.144 | SILUV | 1.474477 | 1.474623 | 1.474332 | 108.6 |
| 43 | −324.384 | 0.999 | | | | | 108.2 |
| 44 | 317.928 | 23.493 | SILUV | 1.474477 | 1.474623 | 1.474332 | 100.4 |
| 45 | 139.359 | 57.800 | | | | | 90.6 |
| 46 | 0.000 | 0.000 | | | | | 84.0 |

TABLE 4A

| SRF | 1 | 2 | 10 | 13 | 33 |
|---|---|---|---|---|---|
| K | 0 | 0 | 0 | 0 | 0 |
| C1 | 4.502414E−07 | 2.926858E−07 | 1.351396E−07 | 9.457687E−08 | −9.457687E−08 |
| C2 | −4.134066E−11 | −3.546123E−11 | 4.038608E−12 | 2.360083E−12 | −2.360083E−12 |
| C3 | −1.009207E−15 | 4.957139E−16 | −2.487710E−16 | −1.110830E−16 | 1.110830E−16 |
| C4 | 5.203906E−19 | 1.734823E−19 | 1.551639E−20 | 9.206137E−21 | −9.206137E−21 |
| C5 | −5.751903E−23 | −1.529489E−23 | −1.405004E−23 | −1.990656E−24 | 1.990656E−24 |
| C6 | 2.870459E−27 | 4.714738E−28 | 3.258394E−29 | 2.678650E−28 | −2.678650E−28 |

| SRF | 36 | 44 | 45 |
|---|---|---|---|
| K | 0 | 0 | 0 |
| C1 | −1.351396E−07 | −2.926858E−07 | −4.502414E−07 |
| C2 | −4.038608E−12 | 3.546123E−11 | 4.134066E−11 |
| C3 | 2.487710E−16 | −4.957139E−16 | 1.009207E−15 |
| C4 | −1.551639E−20 | −1.734823E−19 | −5.203906E−19 |
| C5 | 1.405004E−23 | 1.529489E−23 | 5.751903E−23 |
| C6 | −3.258394E−29 | −4.714738E−28 | −2.870459E−27 |

TABLE 5

| SURF | RADIUS | THICKNESS | MATERIAL | INDEX1 | INDEX2 | INDEX3 | SEMIDIAM. |
|---|---|---|---|---|---|---|---|
| 0 | 0.000 | 66.365 | | | | | |
| 1 | −199.533 | 15.802 | SILUV | 1.474477 | 1.474623 | 1.474332 | 90.4 |
| 2 | 126.741 | 1.533 | | | | | 93.5 |
| 3 | 848.271 | 36.096 | SILUV | 1.474477 | 1.474623 | 1.474332 | 103.3 |
| 4 | −367.658 | 19.010 | | | | | 103.9 |
| 5 | 407.500 | 21.070 | SILUV | 1.474477 | 1.474623 | 1.474332 | 91.3 |
| 6 | 4053.676 | 85.043 | | | | | 89.6 |
| 7 | −187.800 | 18.098 | SILUV | 1.474477 | 1.474623 | 1.474332 | 62.9 |
| 8 | 123.553 | 64.319 | | | | | 60.6 |
| 9 | 356.148 | 11.492 | SILUV | 1.474477 | 1.474623 | 1.474332 | 73.3 |
| 10 | 463.241 | 39.181 | | | | | 73.5 |
| 11 | −108.121 | 7.128 | LF5 | 1.619068 | 1.619457 | 1.618683 | 74.0 |
| 12 | 1824.505 | 1.404 | | | | | 89.3 |
| 13 | 1376.122 | 44.363 | SILUV | 1.474477 | 1.474623 | 1.474332 | 92.8 |
| 14 | −157.381 | 4.552 | | | | | 95.6 |
| 15 | 443.299 | 56.019 | SILUV | 1.474477 | 1.474623 | 1.474332 | 107.9 |
| 16 | −163.323 | 0.498 | | | | | 108.7 |
| 17 | 0.000 | 0.498 | | | | | 104.2 |
| 18 | 163.323 | 56.019 | SILUV | 1.474477 | 1.474623 | 1.474332 | 108.7 |
| 19 | −443.299 | 4.552 | | | | | 107.9 |
| 20 | 157.381 | 44.363 | SILUV | 1.474477 | 1.474623 | 1.474332 | 95.6 |
| 21 | −1376.122 | 1.404 | | | | | 92.8 |
| 22 | −1824.505 | 7.128 | LF5 | 1.619068 | 1.619457 | 1.618683 | 89.3 |
| 23 | 108.121 | 39.181 | | | | | 74.0 |
| 24 | −463.241 | 11.492 | SILUV | 1.474477 | 1.474623 | 1.474332 | 73.5 |
| 25 | −356.148 | 64.319 | | | | | 73.3 |
| 26 | −123.553 | 18.098 | SILUV | 1.474477 | 1.474623 | 1.474332 | 60.6 |
| 27 | 187.800 | 85.043 | | | | | 62.9 |
| 28 | −4053.676 | 21.070 | SILUV | 1.474477 | 1.474623 | 1.474332 | 89.6 |
| 29 | −407.500 | 19.010 | | | | | 91.3 |
| 30 | 367.658 | 36.096 | SILUV | 1.474477 | 1.474623 | 1.474332 | 103.9 |
| 31 | −848.271 | 1.533 | | | | | 103.3 |
| 32 | 126.741 | 15.802 | SILUV | 1.474477 | 1.474623 | 1.474332 | 93.5 |
| 33 | 199.533 | 66.365 | | | | | 90.4 |
| 34 | 0.000 | 0.000 | | | | | 84.0 |

TABLE 5A

| SRF | 1 | 4 | 6 | 7 | 9 |
|---|---|---|---|---|---|
| K | 0 | 0 | 0 | 0 | 0 |
| C1 | −3.865767E−08 | 1.477249E−07 | −2.970278E−07 | −4.029114E−07 | 1.507906E−07 |
| C2 | −1.676923E−11 | −3.793500E−11 | 4.747555E−11 | 4.815137E−11 | −1.584248E−11 |
| C3 | −1.780786E−16 | 1.545914E−15 | −4.137536E−15 | 2.983414E−15 | 8.832833E−16 |
| C4 | 1.791800E−19 | 9.815092E−20 | 3.652948E−19 | −1.759165E−18 | 5.232436E−20 |
| C5 | −2.730495E−23 | −1.120480E−23 | −2.909069E−23 | 2.561074E−22 | −9.661947E−24 |
| C6 | 1.396583E−27 | 2.974752E−28 | 1.237502E−27 | −1.281065E−26 | 7.970738E−28 |

| SRF | 13 | 16 | 18 | 21 | 25 |
|---|---|---|---|---|---|
| K | 0 | 0 | 0 | 0 | 0 |
| C1 | 2.119515E−08 | 3.831308E−08 | −3.831308E−08 | −2.119515E−08 | −1.507906E−07 |
| C2 | −3.529856E−13 | 1.194220E−12 | −1.194220E−12 | 3.529856E−13 | 1.584248E−11 |
| C3 | 3.632528E−16 | 3.596652E−17 | −3.596652E−17 | −3.632528E−16 | −8.832833E−16 |
| C4 | −4.860291E−20 | 1.645053E−21 | −1.645053E−21 | 4.860291E−20 | −5.232436E−20 |
| C5 | 2.514316E−24 | −7.774899E−26 | 7.774899E−26 | −2.514316E−24 | 9.661947E−24 |
| C6 | −4.975080E−29 | 2.819935E−30 | −2.819935E−30 | 4.975080E−29 | −7.970738E−28 |

| SRF | 27 | 28 | 30 | 33 |
|---|---|---|---|---|
| K | 0 | 0 | 0 | 0 |
| C1 | 4.029114E−07 | 2.970278E−07 | −1.477249E−07 | 3.865767E−08 |
| C2 | −4.815137E−11 | −4.747555E−11 | 3.793500E−11 | 1.676923E−11 |
| C3 | −2.983414E−15 | 4.137536E−15 | −1.545914E−15 | 1.780786E−16 |
| C4 | 1.759165E−18 | −3.652948E−19 | −9.815092E−20 | −1.791800E−19 |
| C5 | −2.561074E−22 | 2.909069E−23 | 1.120480E−23 | 2.730495E−23 |
| C6 | 1.281065E−26 | −1.237502E−27 | −2.974752E−28 | −1.396583E−27 |

TABLE 6

| SURF | RADIUS | THICKNESS | MATERIAL | INDEX1 | INDEX2 | INDEX3 | SEMIDIAM. |
|---|---|---|---|---|---|---|---|
| 0 | 0.000 | 75.810 | | | | | |
| 1 | −245.191 | 20.980 | SIL UV | 1.474477 | 1.474623 | 1.474332 | 94.1 |
| 2 | −139.596 | 27.771 | | | | | 96.1 |
| 3 | 171.276 | 42.632 | SILUV | 1.474477 | 1.474623 | 1.474332 | 97.1 |
| 4 | 8532.088 | 87.623 | | | | | 95.7 |
| 5 | −196.785 | 6.999 | SILUV | 1.474477 | 1.474623 | 1.474332 | 64.6 |
| 6 | 144.025 | 71.168 | | | | | 62.4 |
| 7 | 276.899 | 11.318 | SILUV | 1.474477 | 1.474623 | 1.474332 | 72.3 |
| 8 | 358.279 | 41.122 | | | | | 72.2 |
| 9 | −102.925 | 6.998 | LF5 | 1.619068 | 1.619457 | 1.618683 | 72.4 |
| 10 | 1685.182 | 4.768 | | | | | 87.2 |
| 11 | 4395.516 | 47.601 | SILUV | 1.474477 | 1.474623 | 1.474332 | 92.3 |
| 12 | −168.929 | 0.998 | | | | | 97.1 |
| 13 | 423.713 | 53.723 | SILUV | 1.474477 | 1.474623 | 1.474332 | 108.2 |
| 14 | −161.935 | 0.498 | | | | | 108.7 |
| 15 | 0.000 | 0.498 | | | | | 104.3 |
| 16 | 161.935 | 53.723 | SILUV | 1.474477 | 1.474623 | 1.474332 | 108.7 |
| 17 | −423.713 | 0.998 | | | | | 108.2 |
| 18 | 168.929 | 47.601 | SILUV | 1.474477 | 1.474623 | 1.474332 | 97.1 |
| 19 | −4395.516 | 4.768 | | | | | 92.3 |
| 20 | −1685.182 | 6.998 | LF5 | 1.619068 | 1.619457 | 1.618683 | 87.2 |
| 21 | 102.925 | 41.122 | | | | | 72.4 |
| 22 | −358.279 | 11.318 | SILUV | 1.474477 | 1.474623 | 1.474332 | 72.2 |
| 23 | −276.899 | 71.168 | | | | | 72.3 |
| 24 | −144.025 | 6.999 | SILUV | 1.474477 | 1.474623 | 1.474332 | 62.4 |
| 25 | 196.785 | 87.623 | | | | | 64.6 |
| 26 | −8532.088 | 42.632 | SILUV | 1.474477 | 1.474623 | 1.474332 | 95.7 |
| 27 | −171.276 | 27.771 | | | | | 97.1 |
| 28 | 139.596 | 20.980 | SILUV | 1.474477 | 1.474623 | 1.474332 | 96.1 |
| 29 | 245.191 | 75.810 | | | | | 94.1 |
| 30 | 0.000 | 0.000 | | | | | 84.0 |

TABLE 6A

| SRF | 1 | 2 | 4 | 5 | 7 |
|---|---|---|---|---|---|
| K | 0 | 0 | 0 | 0 | 0 |
| C1 | 2.678285E−07 | 3.168599E−07 | −1.933666E−07 | −3.602011E−07 | 1.249264E−07 |
| C2 | −4.180387E−11 | −3.046929E−11 | 3.098033E−11 | 4.075956E−11 | −1.419538E−11 |
| C3 | −3.200353E−15 | −4.385053E−15 | −4.010763E−15 | −1.397169E−15 | 8.232973E−16 |
| C4 | 7.607847E−19 | 9.452445E−19 | 3.681612E−19 | 1.006822E−19 | 3.296397E−20 |
| C5 | −3.738705E−23 | −6.704496E−23 | −1.951021E−23 | −4.108267E−23 | −1.351250E−23 |
| C6 | 6.471811E−28 | 1.926133E−27 | 4.511682E−28 | 3.968684E−27 | 1.789603E−27 |

| SRF | 11 | 14 | 16 | 19 | 23 |
|---|---|---|---|---|---|
| K | 0 | 0 | 0 | 0 | 0 |
| C1 | 4.486274E−08 | 4.340755E−08 | −4.340755E−08 | −4.486274E−08 | −1.249264E−07 |
| C2 | −1.534573E−12 | 1.330151E−12 | −1.330151E−12 | 1.534573E−12 | 1.419538E−11 |
| C3 | 4.347996E−16 | 3.621365E−17 | −3.621365E−17 | −4.347996E−16 | −8.232973E−16 |
| C4 | −4.481159E−20 | 1.688777E−21 | −1.688777E−21 | 4.481159E−20 | −3.296397E−20 |
| C5 | 1.473479E−24 | −8.437869E−26 | 8.437869E−26 | −1.473479E−24 | 1.351250E−23 |
| C6 | −3.605964E−30 | 2.740874E−30 | −2.740874E−30 | 3.605964E−30 | −1.789603E−27 |

| SRF | 25 | 26 | 28 | 29 |
|---|---|---|---|---|
| K | 0 | 0 | 0 | 0 |
| C1 | 3.602011E−07 | 1.933666E−07 | −3.168599E−07 | −2.678285E−07 |
| C2 | −4.075956E−11 | −3.098033E−11 | 3.046929E−11 | 4.180387E−11 |
| C3 | 1.397169E−15 | 4.010763E−15 | 4.385053E−15 | 3.200353E−15 |
| C4 | −1.006822E−19 | −3.681612E−19 | −9.452445E−19 | −7.607847E−19 |
| C5 | 4.108267E−23 | 1.951021E−23 | 6.704496E−23 | 3.738705E−23 |
| C6 | −3.968684E−27 | −4.511682E−28 | −1.926133E−27 | −6.471811E−28 |

TABLE 7

| Design | N336a | N342a | N343a | N344a | N345a |
|---|---|---|---|---|---|
| NA | 0.18 | 0.18 | 0.18 | 0.18 | 0.18 |
| OBH | 84 | 84 | 84 | 84 | 84 |
| Scale | −1 | −1 | −1 | −1 | −1 |
| LLW | 15.12 | 15.12 | 15.12 | 15.12 | 15.12 |

What is claimed is:

1. A projection lens having an object plane, an image plane and an optical axis, the projection lens comprising:

a multiplicity of lens elements between the object plane and the image plane along the optical axis, wherein:

the multiplicity of lens elements is configured to image a pattern in the object plane into the image plane via UV radiation at an operating wavelength of greater than 280 nm;

a stop plane configured to have an aperture stop attached thereto is between the object plane and the image plane so that a chief ray of the UV radiation intersects the optical axis in the stop plane;

the multiplicity of lens elements comprises at least two positive lens elements on each side of the stop plane and directly next to the stop plane;

the projection lens is a large field lens having an object field radius of at least 52 mm and a structure with an imaging scale of 1:1 which is mirror symmetric with respect to the stop plane; and the projection lens is a dioptric projection lens.

2. The projection lens of claim 1, wherein the object field radius is at least 84 mm.

3. The projection lens of claim 1, wherein an object-side numerical aperture is less than 0.3, and an image-side numerical aperture is less than 0.3.

4. The projection lens of claim 1, wherein:

the projection lens has an object field radius, an object-side numerical aperture, and a geometric étendue;

the geometric étendueis the product of the object field radius and the object-side numerical aperture; and the geometric étendueis at least 10 mm.

5. The projection lens of claim 1, wherein:

the projection lens has an installation length TT measured between the object plane and the image plane, an object field radius OBH, and an object-side numerical aperture NAO; and $$(OBH \cdot NAO)/TT > 0.01.$$

6. The projection lens of claim 1, wherein the multiplicity of lens elements comprises:

a flint lens element comprising a first material having a first Abbe number; and a crown lens element comprising a second material having a second Abbe number which is greater than the first Abbe number.

7. The projection lens of claim 1, wherein projection lens comprises only a single flint lens element, and the single flint lens element has negative refractive power.

8. The projection lens of claim 7, wherein the single flint lens element is in a region in which:

a ratio of a chief ray height to a marginal ray height is less than 0.5; and/or the single flint lens element is a biconcave lens element.

9. The projection lens of claim 1, wherein the multiplicity of lens elements comprises a flint lens element with positive refractive power on each side of the stop plane.

10. The projection lens of claim 1, wherein the multiplicity of lens elements comprises a flint lens element in an optical vicinity of a field plane in a region in which a ratio of a chief ray height to a marginal ray height is at least 0.7.

11. The projection lens of claim 1, wherein at least one of the lens elements on each side of the stop plane is an asphere comprising a rotationally symmetric aspherical lens element surface.

12. The projection lens of claim 11, wherein at least one of the aspheres comprises a double asphere comprising an entrance surface that is a rotationally symmetric aspherical lens surface and an exit surface that that is a rotationally symmetric aspherical lens surface.

13. The projection lens of claim 1, wherein the UV radiation corresponds to the i-line of a mercury vapour lamp, and/or the UV radiation has a bandwidth of no more than 5 nanometers.

14. The projection lens of claim 1, wherein the object field radius is at least 84 mm, an object-side numerical aperture is less than 0.3, and an image-side numerical aperture is less than 0.3.

15. A method of using an apparatus comprising an illumination system and a projection lens, the method comprising:

using the illumination system to illuminate a pattern in an object plane of the projection lens; and using the projection lens to image the illuminated pattern into a radiation-sensitive material in an image plane of the projection lens, wherein the projection lens is a projection lens according to claim 1.

16. The method of claim 15, comprising:

using a step-and-repeat process without scanning; and/or using illumination radiation of the i-line of a mercury vapour lamp and/or illumination radiation with a bandwidth of less than 5 nm.

17. The projection lens of claim 1, wherein the multiplicity of lens elements comprises three lens elements on each side of the stop plane and directly next to the stop plane.

18. An apparatus, comprising:

a light source configured to emit UV radiation at an operating wavelength of greater than 280 nm;

an illumination system; and a dioptric projection lens, wherein:

the projection lens comprises a multiplicity of lens elements between the object plane and the image plane along the optical axis;

the multiplicity of lens elements is configured to image a pattern in the object plane into the image plane via UV radiation at an operating wavelength of greater than 280 nm;

a stop plane configured to have an aperture stop attached thereto is between the object plane and the image plane so that a chief ray of the UV radiation intersects the optical axis in the stop plane;

the multiplicity of lens elements comprises at least two positive lens elements on each side of the stop plane and directly next to the stop plane;

the projection lens is a large field lens having an object field radius of at least 52 mm and a structure with an imaging scale of 1:1 which is mirror symmetric with respect to the stop plane; and the illumination system configured to receive the UV radiation and provide illumination radiation directed at a pattern in the object plane.

19. The apparatus of claim 18, wherein the apparatus is a wafer-stepper configured to perform a step-and-repeat process.

20. The apparatus of claim 18, wherein:

the light source is a mercury vapour lamp, and the UV radiation corresponds to the i-line of the mercury vapour lamp; and/or the UV radiation has a bandwidth of no more than 5 nanometers.

21. The apparatus of claim 18, wherein the multiplicity of lens elements comprises three lens elements on each side of the stop plane and directly next to the stop plane.

* * * * *